United States Patent
Pindl

(10) Patent No.: US 6,563,179 B2
(45) Date of Patent: May 13, 2003

(54) MOS TRANSISTOR AND METHOD FOR PRODUCING THE TRANSISTOR

(75) Inventor: Stephan Pindl, Bad Abbach (DE)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 10/095,242

(22) Filed: Mar. 11, 2002

(65) Prior Publication Data

US 2002/0113255 A1 Aug. 22, 2002

Related U.S. Application Data

(63) Continuation of application No. PCT/DE00/03062, filed on Sep. 5, 2000.

(30) Foreign Application Priority Data

Sep. 9, 1999 (DE) .......................................... 199 43 114

(51) Int. Cl.$^7$ .......................... H01L 29/76; H01L 29/94; H01L 31/062; H01L 31/113; H01L 31/119
(52) U.S. Cl. .................... 257/382; 257/377; 257/378; 257/379; 257/380; 257/384; 257/412
(58) Field of Search ................................ 257/382–388, 257/377, 411, 412, 413

(56) References Cited

U.S. PATENT DOCUMENTS

| 4,822,754 | A | | 4/1989 | Lynch et al. ................. 257/382 |
| 6,346,732 | B1 | * | 2/2002 | Mizushima et al. ......... 257/382 |
| 6,218,710 | B1 | * | 4/2002 | Koh ............................ 257/382 |
| 6,373,108 | B1 | * | 4/2002 | Yamakawa et al. .......... 257/382 |
| 6,326,664 | B1 | * | 12/2002 | Chau et al. .................. 257/344 |

FOREIGN PATENT DOCUMENTS

| EP | 0 268 941 B1 | 6/1988 | ................. 257/382 |
| JP | 55 022 887 | 2/1980 | ................. 257/382 |

OTHER PUBLICATIONS

Chao, C.–P. et al.: "Low Resistance Ti or Co Salicided Raised Source/Drain Transistors for Sub–0.13 $\mu$m CMOS Technologies", IEEE, 1997.
Colinge, J.–P.: "Silicon–on–Insulator Technology: Materials to VLSI", Kluwer Academic Publishers, 1991, pp. 106–113.
Griffin, P. B. et al.: "Species, Dose and Energy Dependence of Implant Induced Transient Enhanced Diffusion", IEEE, 1993, pp. 12.2.1–12.2.4.
Wakabayashi, H. et al.: "A High–Performance 0.1 $\mu$m CMOS with Elevated Salicide using Novel Si–SEG Process", IEEE, 1997.
Colinge, J.–P.: "Silicon–on–Insulator Technology: Materials to VLSI", Kluwer Academic Publishers, 1991, pp. 120–123.
Drowley, C. et al.: "Conditions for Uniform Selective Epitaxial Growth", Solid State Technology, May 1990, pp. 135–141.

* cited by examiner

Primary Examiner—Eddie Lee
Assistant Examiner—Jesse A. Fenty
(74) Attorney, Agent, or Firm—Laurence A. Greenberg; Werner H. Stemer; Ralph E. Locher

(57) ABSTRACT

Terminal regions of source/drain zones of an MOS transistor are configured over the substrate in the form of conductive structures, are separated from the substrate by separating layers, and exhibit a larger horizontal cross-section than doped regions forming the source/drain zones that are arranged in the substrate.

2 Claims, 2 Drawing Sheets

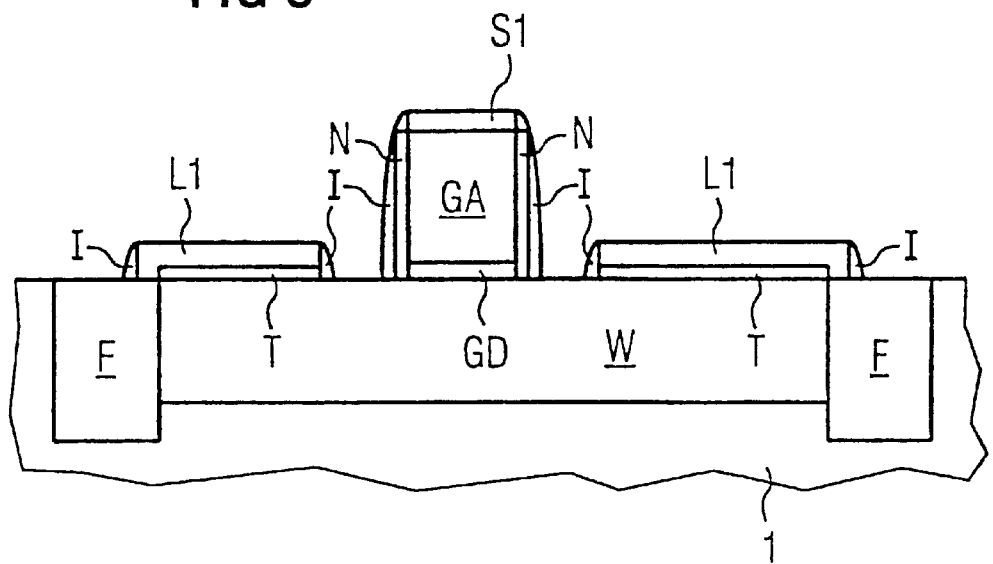
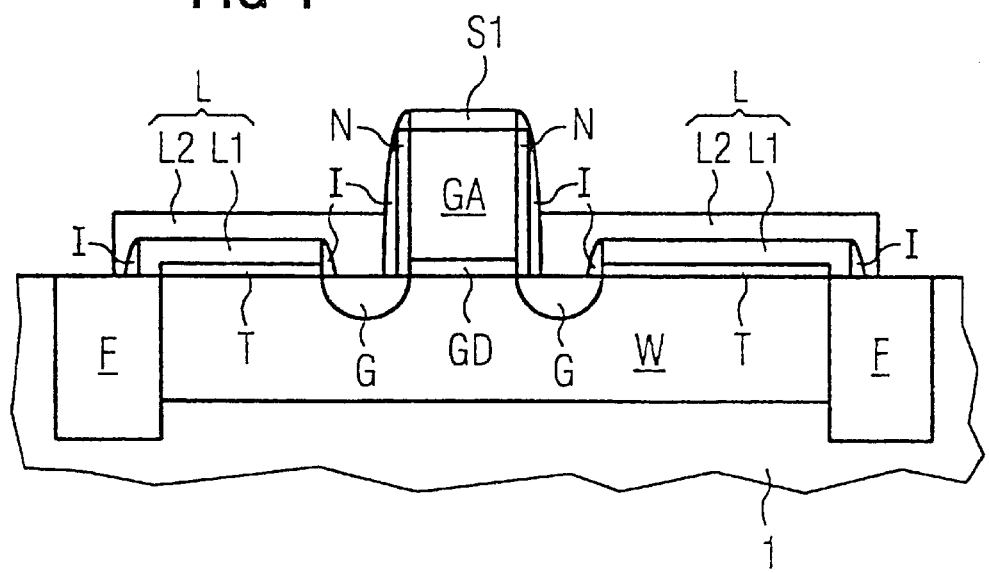

MOS TRANSISTOR AND METHOD FOR PRODUCING THE TRANSISTOR

CROSS-REFERENCE TO RELATED APPLICATION

This application is a continuation of copending International Application PCT/DE00/03062, filed Sep. 5, 2000, which designated the United States.

BACKGROUND OF THE INVENTION

1. Field of the Invention

The present invention relates to an MOS transistor. To increase the packing density of an integrated circuit configuration requires MOS transistors with channel lengths that are continually being made shorter. What is particularly problematic about miniaturization is short channel effects, which can be reduced by particularly flat source/drain zones.

This type of MOS transistor is described in European Patent Application EP 0268 941. The flat source/drain zones are created by dopant diffusion from overlying doped silicon layers. Source-drain terminals consisting of silicide are disposed on the silicon layers for the purpose of lowering the electrical resistance of the MOS transistor. The silicon layers serve both as the dopant source and as protection against shorts between the silicide source-drain terminals and the substrate. The silicon layers are created by selective epitaxy between a gate electrode of the transistor and field oxide regions that surround the transistor.

SUMMARY OF THE INVENTION

It is accordingly an object of the invention to provide an MOS transistor and a method for producing the transistor which overcome the above-mentioned disadvantages of the prior art apparatus and methods of this general type.

In particular, it is an object of the invention to provide an MOS transistor that exhibits fewer short channel effects and fewer leakage currents when compared to prior art MOS transistors, and wherein the capacitances formed by the source/drain zones and the substrate are smaller when compared to prior art MOS transistors.

With the foregoing and other objects in view there is provided, in accordance with the invention, a metal oxide semiconductor transistor that includes: a substrate having two doped regions located therein; a gate electrode configured on the substrate between the two doped regions; a gate dielectric separating the gate electrode from the substrate; two isolating separating layers of silicon nitride disposed on the substrate; conductive structures; and isolating structures. The gate electrode has two opposite lateral surfaces. Each one of the two opposite lateral surfaces of the gate electrode is provided with a respective one of the isolating structures. The gate electrode and the doped regions are configured between the two isolating separating layers. The two isolating separating layers are situated at a distance away from the gate electrode. The two doped regions have boundary surfaces. Each one of the boundary surfaces is located between the gate electrode and a respective one of the two isolating separating layers. Each one of the conductive structures is disposed on a respective one of the two isolating separating layers. Each one of the conductive structures laterally protrudes beyond the respective one of the two isolating separating layers to adjoin a respective one of the isolating structures and a respective one of the boundary surfaces.

In accordance with an added feature of the invention, the conductive structures consist substantially of doped silicon.

In accordance with an additional feature of the invention, the conductive structures consist substantially of doped silicon.

With the foregoing and other objects in view there is provided, in accordance with the invention, a method for producing a metal oxide semiconductor transistor, which includes steps of: forming a gate dielectric on a substrate; forming a gate electrode on the gate dielectric; subsequent to forming the gate electrode, forming spacing structures at two opposite lateral surfaces of the gate electrode; performing a nitridation step such that a layer of silicon nitride is formed on the substrate beneath the spacing structures but not on the spacing structures; forming first portions of conductive structures on exposed portions of the layer of silicon nitride by selectively epitaxially growing silicon; removing the spacing structures and portions of the layer of silicon nitride located beneath the spacing structures, thereby forming two separating layers from the layer of silicon nitride; providing at least each of the two opposite lateral surfaces of the gate electrode with a respective isolating structure; forming each one of the conductive structures on a respective one of the two separating layers such that each one of the conductive structures protrudes laterally beyond the respective one of the two separating layers beneath it, adjoins the isolating structure on a respective one of the two opposite lateral surfaces of the gate electrode, and adjoins a portion of the substrate that is located between the gate electrode and the respective one of the two separating layers; using the two separating layers and the gate electrode as masks while incorporating dopant into the substrate to form a first doped region in a portion of the substrate that adjoins the one of the conductive structures on one of the two separating layers and to form a second doped region in a portion of the substrate that adjoins the conductive structure on another one of the two separating layers; and forming second portions of the conductive structures by selectively epitaxially growing silicon.

In accordance with an added mode of the invention, the spacing structures are formed as spacers by depositing and etching-back a material.

In accordance with an additional mode of the invention, the step of incorporating the dopant into the substrate is performed by: doping the conductive structures with the dopant; and using the two separating layers as diffusion barriers while performing a tempering step such that a portion of the dopant diffuses into the substrate from the conductive structures to form the first doped region and the second doped region.

In accordance with another mode of the invention, the step of doping the conductive structures is performed by implanting the dopant with an energy such that a maximum concentration of the dopant occurs near the two separating layers.

In accordance with a further mode of the invention, the step of doping the conductive structures is performed in situ during a selective epitaxy step.

The objects of the invention are solved by providing an MOS transistor wherein a gate electrode is disposed on a substrate and is isolated therefrom by a gate dielectric. Each of at least two opposing lateral surfaces of the gate electrode is respectively provided with an isolating structure. The gate electrode is disposed between two doped regions that are disposed in the substrate. The gate electrode and the doped regions are disposed between two separating layers that are disposed on the substrate. A respective conductive structure is disposed on each of the insulating layers. Each conductive structure projects laterally beyond the underlying separating layer in such a way that it adjoins one of the isolating structures and the doped region that is disposed between the gate electrode and the separating layer.

The object of the invention is also solved by a method for producing an MOS transistor wherein a gate dielectric is created on a substrate. A gate electrode is created on the gate dielectric. Two separating layers are created on the substrate in such a way that the gate electrode is arranged between them and is separated away from them. At least two opposite side surfaces of the gate electrode are each provided with an isolating structure. On each of the separating layers, a conductive structure is created which protrudes laterally beyond the separating layer beneath it in such a way that it adjoins one of the isolating structures and a part of the substrate which is disposed between the gate electrode and the separating layer. In the parts of the substrate adjoining the conductive structures, two doped regions are created by incorporating dopant into the substrate, during which the separating layers and the gate electrode act as masks.

The doped regions are thus created between the gate electrode and the separating layers.

The doped regions can be connected by way of the conductive structures. The doped regions act as the source and drain of the MOS transistor.

Given that the conductive structures are disposed not only on the doped regions, but also on the separating layers, and that the doped regions are disposed between the gate electrode and the separating layers, horizontal cross-sections of the conductive structures are larger than horizontal cross-sections of the doped regions. The conductive structures can consequently be produced with the requisite size for the terminal and for the low electrical resistance of the MOS transistor, while the doped regions can be significantly smaller. The reduction of the horizontal cross-section of the doped regions effectuates fewer short channel effects. Furthermore, the capacitances formed by the doped regions and the substrate are particularly small because of the small extent of the doped regions. Because the conductive structures are separated from the substrate by the separating layers, capacitances that are formed by the conductive structures and the substrate are also particularly small.

The small extent of the doped regions and the separating layers also results in small leakage currents between the source or drain and the substrate.

If the MOS transistor is surrounded by a field oxide, the conductive structures are disposed in all of the areas between the gate electrode and the field oxide, whereas the doped regions are disposed only in areas near the gate electrode.

The separating layers are disposed on the substrate and do not extend into it. More specifically, the separating layers extend into the substrate no deeper than the doped regions.

The separating layers can be created by structuring a deposited layer of insulating material, for instance $SiO_2$.

To avoid masks requiring aligning in the structuring process, which raise the processing expenditure and open up the possibility of alignment problems, the separating layers can be created by using spacing structures.

To accomplish this, first the spacing structures and then the separating layers are created at the side surfaces of the gate electrode.

For instance, the separating layers are created by depositing an isolating layer which is thicker than the gate electrode, planarizing it, and then etching it back in such a way that the gate electrode protrudes. The spacing structures are then removed.

If the separating layers are not intended to cover the field oxide, the isolating material on the field oxide must still be removed using a mask. Alternatively, this step can be spared if a silicon nitride layer is created by nitridation, so that the silicon nitride layer is created on boundary surfaces of the silicon. That is, the silicon nitride layer is also created under the spacing structures on the substrate, but not on outer surfaces of the spacing structures or on the field oxide. The separating layers are created from the silicon nitride layer in that exposed potions of the silicon nitride layer are covered with material, the spacing structures are removed, and portions of the silicon nitride layer disposed beneath the spacing structures are removed selectively with respect to the material. Because the silicon nitride layer does not grow on the field oxide, the separating layers do not cover the field oxide. The exposed portions of the silicon nitride layer are covered in that the material is deposited, planarized and etched back until the spacing structures are exposed. Alternatively, the material, for instance silicon, is selectively grown onto the silicon nitride layer, so that the spacing structures are not covered. Instead of silicon nitride, a different material that grows selectively on silicon can be utilized for the layer from which the separating layers are created.

The conductive structures can consist of a silicide, a salicide, or a metal. To accomplish this, the corresponding material is deposited with a larger thickness than the gate electrode, planarized, and etched back in such a way that the gate electrode protrudes. The conductive structures thus adjoin the isolating structures in a self-aligning fashion. In order to remove the material on the field oxide, the material can be etched back using a mask.

To simplify the process, this mask can be forgone, and the conductive structures can be created on the separating layers by selective epitaxy. In this case, the conductive structures substantially consist of silicon, and the separating layers consist of silicon nitride. In order to reduce the electrical resistance of the MOS transistor, the conductive structures are preferably heavily doped. The conductive structures act as HDD regions of the source/drain zones of the transistor, while the doped regions act as LDD (Lightly Doped Drain) regions of the source/drain zones of the MOS transistor. The processing outlay for creating the heavily doped HDD (Heavily Doped Drain) regions and the lightly doped LDD regions is particularly small, because only a single implantation step is required.

In this case, the separating layers additionally act as diffusion barriers, which prevents a flat drop of the dopant concentration in the junction from the conductive structure to the substrate, and prevents a consequently high capacitance.

If the separating layers are created using spacing structures and nitridation, it is advantageous first to create first portions of the conductive structures by selective epitaxy after creating the silicon nitride layer. The first portions of the conductive structures will consequently be disposed on the separating layers that are being created. The first portions of the conductive structures act to cover the separating layers during the removal of the portions of the silicon nitride layer located beneath the spacing structures. Once the spacing structures and the underlying portions of the silicon nitride layer have been removed, second portions of the conductive structures are created by the selective epitaxy of silicon. The second portions of the conductive structures are consequently disposed on the first portions of the conductive structures and on the doped regions. In the selective epitaxy of silicon, the silicon grows only on silicon and silicon nitride, but not on other materials such as $SiO_2$ of which the isolating structures and the field oxide consist.

The doped silicon of the conductive structures serves as the dopant source for creating the doped regions. To accomplish this, part of the dopant diffuses from the conductive structures into the substrate in a tempering step and forms the doped regions there. During this process, the separating layers act as diffusion barriers. The doped regions emerge self-aligned between the gate electrode and the separating layers. The depth of the doped regions is determined by the temperature and the time of the tempering step.

In order to set this depth particularly precisely, it is advantageous to dope the conductive structures in situ. The dopant is thus embedded in the conductive structures during the selective epitaxy.

Alternatively, dopant is implanted after the conductive structures are created. Advantageously, the energy with which the implantation is performed is such that the maximum dopant concentration occurs in the area of the separating layers. A particularly high dopant concentration can be achieved by implantation.

The smaller the horizontal cross-section of the doped regions, the smaller the leakage currents, short channel effects, and capacitance. It is therefore expedient when the spaces between the gate electrode and the separating layers are particularly small. They are preferably smaller than the minimum structural size that can be produced in the respective technology. The corresponding spacing structures can be created in the form of spacers by the deposition and etch-back of material.

Other features which are considered as characteristic for the invention are set forth in the appended claims.

Although the invention is illustrated and described herein as embodied in a MOS transistor and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows the cross-section in FIG. 2, following the removal of the spacing structures, the second guard layer, and portions of the silicon nitride layer that are located beneath the spacing structures, and following the creation of isolating structures; and FIG. 4 shows the cross-section in FIG. 3, following the creation of second portions of the conductive structures and the creation of doped regions.

DESCRIPTION OF THE PREFERRED EMBODIMENTS

Figure 1:
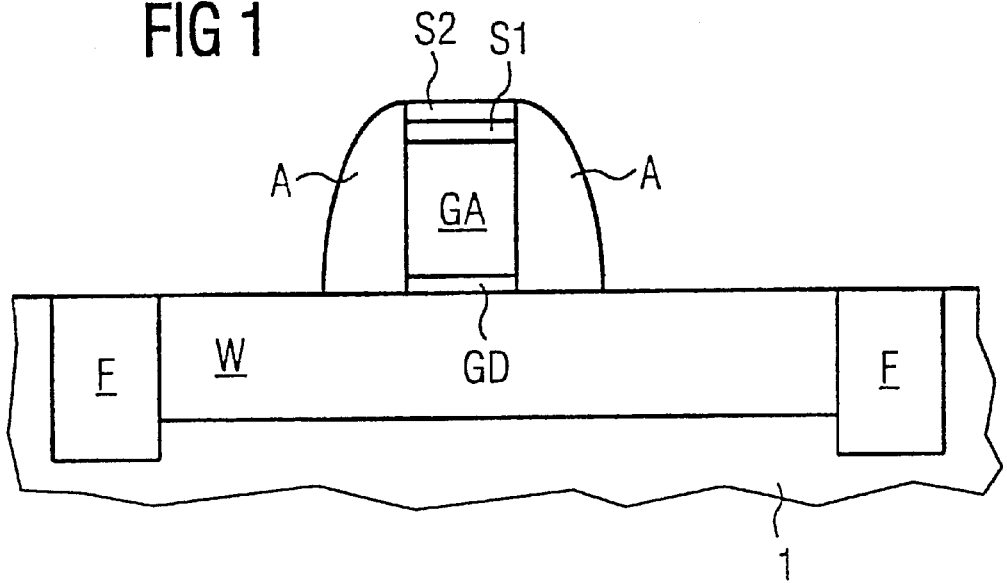
FIG. 1 shows a cross-section through a substrate following the creation of a field oxide, a trough, a gate dielectric, a gate electrode, a first guard layer, a second guard layer and spacing structures.

It is noted that the figures are not drawn true to scale. Referring now to the figures of the drawing in detail and first, particularly, to FIG. 1 thereof, there is shown an exemplary embodiment of a silicon substrate 1 in which a field oxide F surrounds an MOS transistor that is being created using known steps.

A p-doped trough W that is surrounded by the field oxide F is created by implantation. The dopant concentration of the trough W equals approximately $10^{17}$ cm$^{-3}$ (see FIG. 1).

$SiO_2$ is grown on the substrate 1 in a thickness of approximately 3 nm by thermal oxidation. Next, polysilicon is deposited in a thickness of approximately 200 nm. Over this an approximately 40-nm-thick first guard layer consisting of silicon nitride S1 and an approximately 60-nm-thick second guard layer S2 consisting of $SiO_2$ are created.

The second guard layer S2, the first guard layer S1, the polysilicon, and the $SiO_2$ are structured by masked etching such that the polysilicon forms a gate electrode GA of the MOS transistor. The gate electrode GA is separated from the substrate 1 by a gate dielectric GD formed by the $SiO_2$, and the gate electrode GA is covered by the first guard layer S1 and the second guard layer S2 (see FIG. 1).

Next, spacing structures A are created by depositing $SiO_2$ in a thickness of approximately 150 nm and etching the $SiO_2$ back. The spacing structures A are disposed at the lateral surfaces of the gate electrode GA (see FIG. 1).

Figure 2:
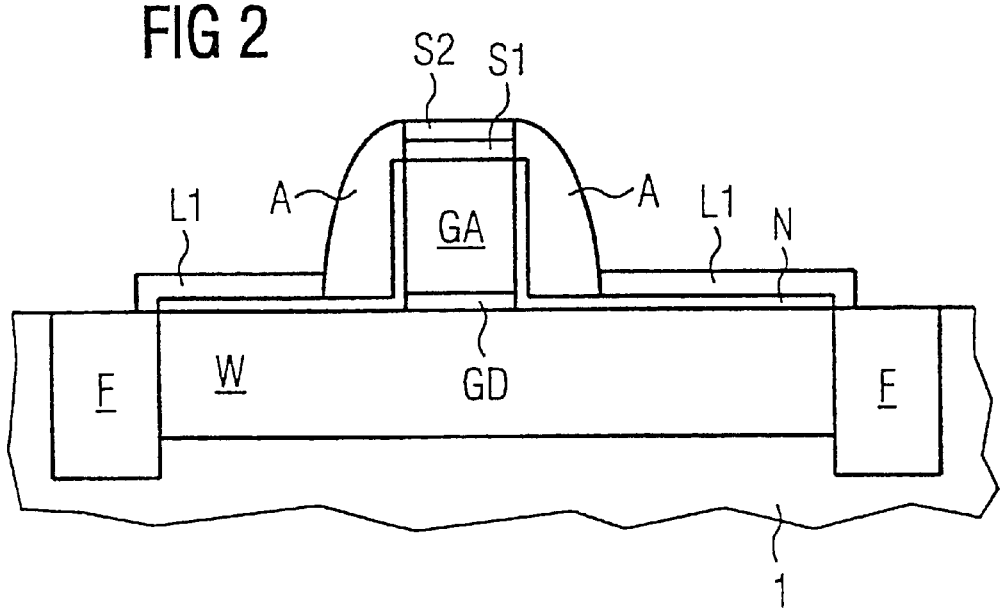
FIG. 2 shows the cross-section in FIG. 1, following the creation of a silicon nitride layer and first portions of conductive structures.

A layer of silicon nitride N with a thickness of approximately 3 nm is created in a self-aligned fashion using nitridation, for instance, in an ammonia atmosphere, at all boundary surfaces of the silicon except in the region of the gate dielectric GD and in the region of the first guard layer S1 (see FIG. 2). The layer of silicon nitride N is also disposed on the substrate 1 beneath the spacing structures A.

In order to create first portions L1 of conductive structures L, a selective epitaxy process is carried out in such a way that silicon grows only on silicon nitride and not on $Sio_2$. The first portions L1 of the conductive structures L, which are approximately 50 nm thick, thus emerge on previously exposed portions of the layer of silicon nitride N (see FIG. 2).

By wet etching, for instance with HF acid, $SiO_2$ is removed selectively with respect to silicon nitride and silicon, so that the second guard layer S2 and the spacing structures A are removed (see FIG. 3).

To create isolating structures I, $SiO_2$ is deposited in a thickness of approximately 30 nm and is etched back. The isolating structures I are created in the form of spacers at lateral surfaces of the gate electrode GA and of the first portions L1 of the conductive structures L. The lateral surfaces of the gate electrode GA that are covered by the silicon nitride layer N are consequently provided with some of the isolating structures I. Silicon nitride is also attacked in the etch-back of the $SiO_2$, so that portions of the substrate 1 located between the gate electrode GA and the first portions L1 of the conductive structures L are exposed (see FIG. 3). The layer of silicon nitride N is thereby divided, in which the portions thereof that were located beneath the spacing structures A have been removed. Separating layers T emerge from remaining portions of the silicon nitride layer N on the substrate 1. Additional portions of the silicon nitride layer N cover lateral surfaces of the gate electrode GA. The gate electrode GA is disposed between the separating layers T and the first portions $L_1$ of the conductive structures L. The gate electrode GA is also separated from the separating layers T and the first portions $L_1$ of the conductive structures L (FIG. 3).

Using selective epitaxy, silicon is grown on the exposed portions of the substrate 1 and on the first portions L1 of the conductive structures L to form second portions L2 of the conductive structures L having a thickness of approximately 50 nm (See FIG. 4). The conductive structures L are thus disposed on the separating layers T and protrude beyond these underlying separating layers T to adjoin the isolating structures I and the portions of the substrate 1 located between the gate electrode GA and the separating layers T.

The conductive structures L are doped by implantation with n-doped ions (e.g. phosphorous) using an implantation energy of approximately 30 KeV.

In a subsequent tempering step, dopant diffuses from the conductive structures L into the substrate 1, so that doped regions G with a thickness of approximately 30 nm are created between the gate electrode GA and the separating layers T acting as diffusion barriers (FIG. 4).

This is followed by processing the MOS transistor according to the prior art, for instance with silicidizing, contacting, inter-oxide and wiring.

The doped regions G are suitable as LDD regions of source/drain zones of the MOS transistor. The conductive structures L are suitable HDD regions of the source/drain zones of the MOS transistor. The separating layers T separate the greater part of the source/drain zones from the substrate 1, so that a boundary surface between the source/drain zones and the substrate 1 is limited to the boundary surface between the doped regions G and the substrate 1, the effect of which is that the leakage currents are small, the capacities formed by the source/drain zones and the substrate are small, and the short channel effects are small.

There are many imaginable variants of the exemplifying embodiment that fall within the scope of the invention. Thus, dimensions of the described layers and structures can be adapted to the respective requirements. The same is true of the selection of utilized materials.

I claim:

1. A metal oxide semiconductor transistor, comprising:
a substrate having two doped regions located therein;
a gate electrode configured on said substrate between said two doped regions;
a gate dielectric separating said gate electrode from said substrate;
two isolating separating layers of silicon nitride disposed on said substrate;
conductive structures; and
isolating structures;
said gate electrode having two opposite lateral surfaces;
each one of said two opposite lateral surfaces of said gate electrode being provided with a respective one of said isolating structures;
said gate electrode and said doped regions being configured between said two isolating separating layers;
said two isolating separating layers being situated at a distance away from said gate electrode;
said two doped regions having boundary surfaces;
each one of said boundary surfaces located between said gate electrode and a respective one of said two isolating separating layers;
each one of said conductive structures being disposed on a respective one of said two isolating separating layers; and
each one of said conductive structures laterally protruding beyond said respective one of said two isolating separating layers to adjoin a respective one of said isolating structures and a respective one of said boundary surfaces.

2. The metal oxide semiconductor transistor according to claim 1, wherein said conductive structures consist substantially of doped silicon.

* * * * *